United States Patent
Lin et al.

(10) Patent No.: US 8,304,349 B2
(45) Date of Patent: Nov. 6, 2012

(54) METHOD TO INTEGRATE GATE ETCHING AS ALL-IN-ONE PROCESS FOR HIGH K METAL GATE

(75) Inventors: Jr Jung Lin, Taichung (TW); Yih-Ann Lin, Hsinchu County (TW); Ryan Chia-Jen Chen, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 472 days.

(21) Appl. No.: 12/367,399

(22) Filed: Feb. 6, 2009

(65) Prior Publication Data

US 2010/0041236 A1 Feb. 18, 2010

Related U.S. Application Data

(60) Provisional application No. 61/089,762, filed on Aug. 18, 2008.

(51) Int. Cl.
*H01L 21/302* (2006.01)

(52) U.S. Cl. ........ 438/706; 438/710; 438/714; 438/591; 257/410

(58) Field of Classification Search .................. 438/710, 438/724, 714, 591, 592; 257/410, 411, 506
See application file for complete search history.

(56) References Cited

U.S. PATENT DOCUMENTS

| | | | |
|---|---|---|---|
| 4,241,165 A * | 12/1980 | Hughes et al. | 430/269 |
| 4,659,426 A * | 4/1987 | Fuller et al. | 438/719 |
| 5,346,586 A * | 9/1994 | Keller | 438/694 |
| 5,908,509 A | 6/1999 | Olesen et al. | |
| 6,099,662 A | 8/2000 | Wang et al. | |
| 6,218,296 B1 * | 4/2001 | Kwak et al. | 438/653 |
| 6,451,647 B1 * | 9/2002 | Yang et al. | 438/240 |
| 6,562,726 B1 | 5/2003 | Torek et al. | |
| 6,746,925 B1 * | 6/2004 | Lin et al. | 438/287 |
| 7,126,199 B2 | 10/2006 | Doczy et al. | |
| 7,153,784 B2 | 12/2006 | Brask et al. | |
| 7,323,403 B2 | 1/2008 | Rotondaro et al. | |

(Continued)

FOREIGN PATENT DOCUMENTS

JP  2007-201215  *  8/2007

OTHER PUBLICATIONS

Wilson, S.R.; Tracy, C.J.; Freeman, J.L., Jr. (1993). Handbook of Multilevel Metallization for Integrated Circuits—Materials, Technology, and Applications.. William Andrew Publishing/Noyes, p. 687-709.*

(Continued)

*Primary Examiner* — Duy Deo
*Assistant Examiner* — Erin Flanagan
(74) *Attorney, Agent, or Firm* — Haynes and Boone, LLP

(57) ABSTRACT

The present disclosure provides a method for making metal gate stacks of a semiconductor device. The method includes applying a first dry etching process to a semiconductor substrate in an etch chamber through openings of a patterned mask layer defining gate regions, removing a polysilicon layer and a metal gate layer on the semiconductor substrate; applying a H2O steam to the semiconductor substrate in the etch chamber, removing a capping layer on the semiconductor substrate; applying a second dry etching process to the semiconductor substrate in the etch chamber, removing a high k dielectric material layer; and applying a wet etching process to the semiconductor substrate to remove polymeric residue.

17 Claims, 2 Drawing Sheets

U.S. PATENT DOCUMENTS

| | | |
|---|---|---|
| 7,488,687 B2 | 2/2009 | Park et al. |
| 8,101,525 B2 * | 1/2012 | Shen et al. .................. 438/710 |
| 2003/0121527 A1 * | 7/2003 | Seo ............................. 134/1.2 |
| 2003/0157734 A1 * | 8/2003 | Engelhardt et al. ............. 438/3 |
| 2003/0219912 A1 | 11/2003 | Chen et al. |
| 2003/0230786 A1 | 12/2003 | Kim et al. |
| 2006/0054181 A1 | 3/2006 | Rayandayan et al. |
| 2006/0160295 A1 | 7/2006 | Kim et al. |
| 2007/0001241 A1 * | 1/2007 | Lim et al. .................... 257/410 |
| 2007/0045753 A1 | 3/2007 | Pae et al. |
| 2007/0051700 A1 | 3/2007 | Lee et al. |
| 2007/0190795 A1 | 8/2007 | Zhuang et al. |
| 2008/0224238 A1 | 9/2008 | Kanakasabapathy et al. |
| 2009/0004870 A1 | 1/2009 | Liu et al. |
| 2009/0194876 A1 | 8/2009 | Yang et al. |

OTHER PUBLICATIONS

Van Zant, Peter (2004). Microchip Fabrication (5th Edition).. McGraw-Hill. p. 245-282.*

Machine translation of JP-2007-201215 retrieved Jun. 14, 2011.*

* cited by examiner

METHOD TO INTEGRATE GATE ETCHING AS ALL-IN-ONE PROCESS FOR HIGH K METAL GATE

CROSS REFERENCE

This application claims the benefit of U.S. Provisional Application 61/089,762 entitled "A NOVEL METHOD TO INTEGRATE GATE ETCHING AS ALL-IN-ONE PROCESS FOR HIGH K METAL GATE," filed Aug. 18, 2008, herein incorporated by reference in its entirety.

BACKGROUND

When a semiconductor device such as a metal-oxide-semiconductor field-effect transistors (MOSFETs) is scaled down through various technology nodes, high k dielectric material and metal are adopted to form a gate stack. In a method to form a metal gate stack, various dry and wet etching processes are implemented. For example, when a capping layer interposed between the high k dielectric material layer and the metal gate layer, a wet etching process is implemented between two dry etching processes in order to remove the capping layer and reduce the severe residue. Thus, it takes multiple etching steps and various etching tools to form a metal gate stack. In this example, it includes a dry etching process, a wet etching process and a second dry etching process. However, such a metal gate etching method involves a complicated processing sequence and a long processing cycle time, and leads to high manufacturing cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
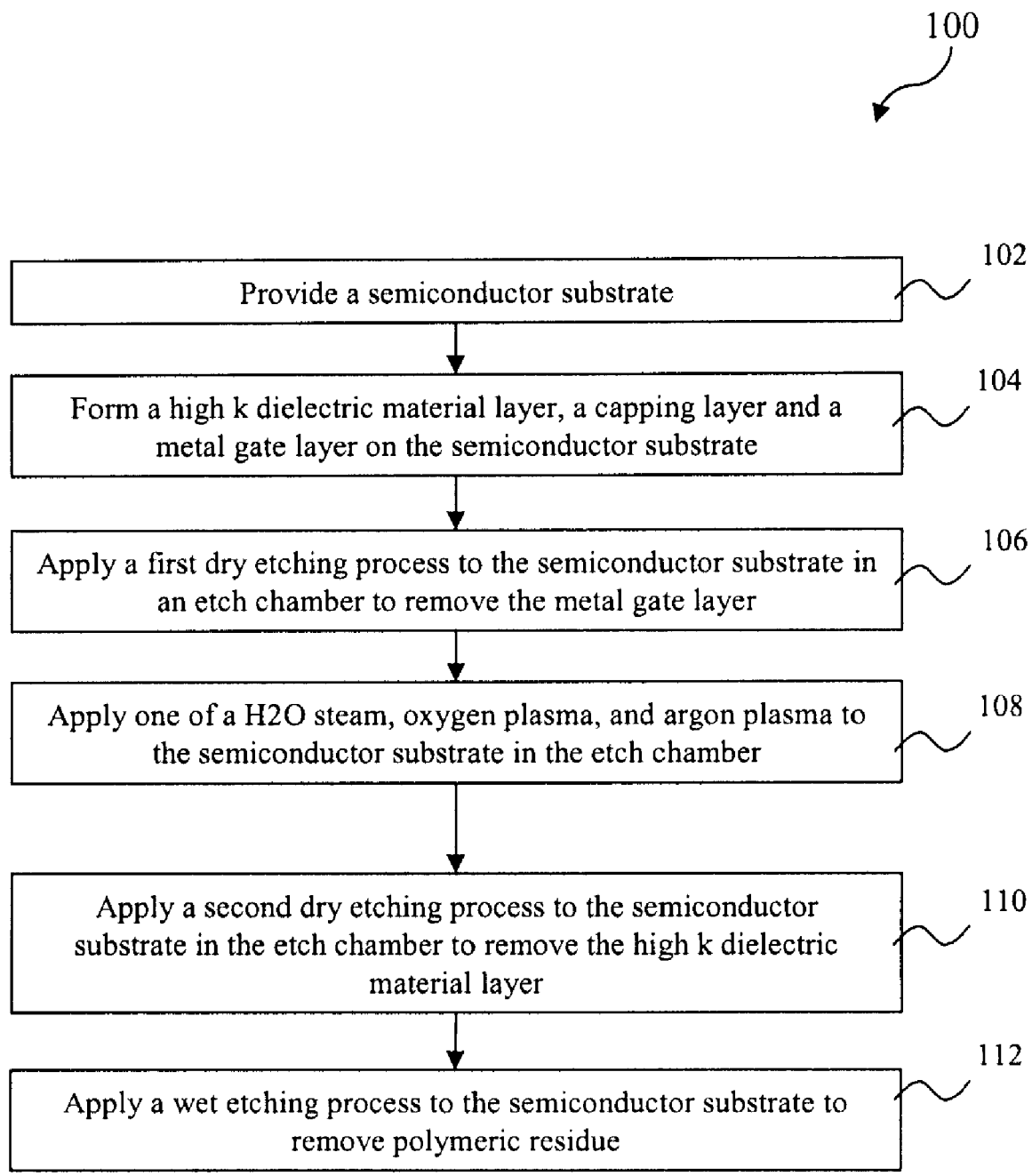
FIG. 1 is a flowchart of a method making a semiconductor device having a metal gate stack in one embodiment constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
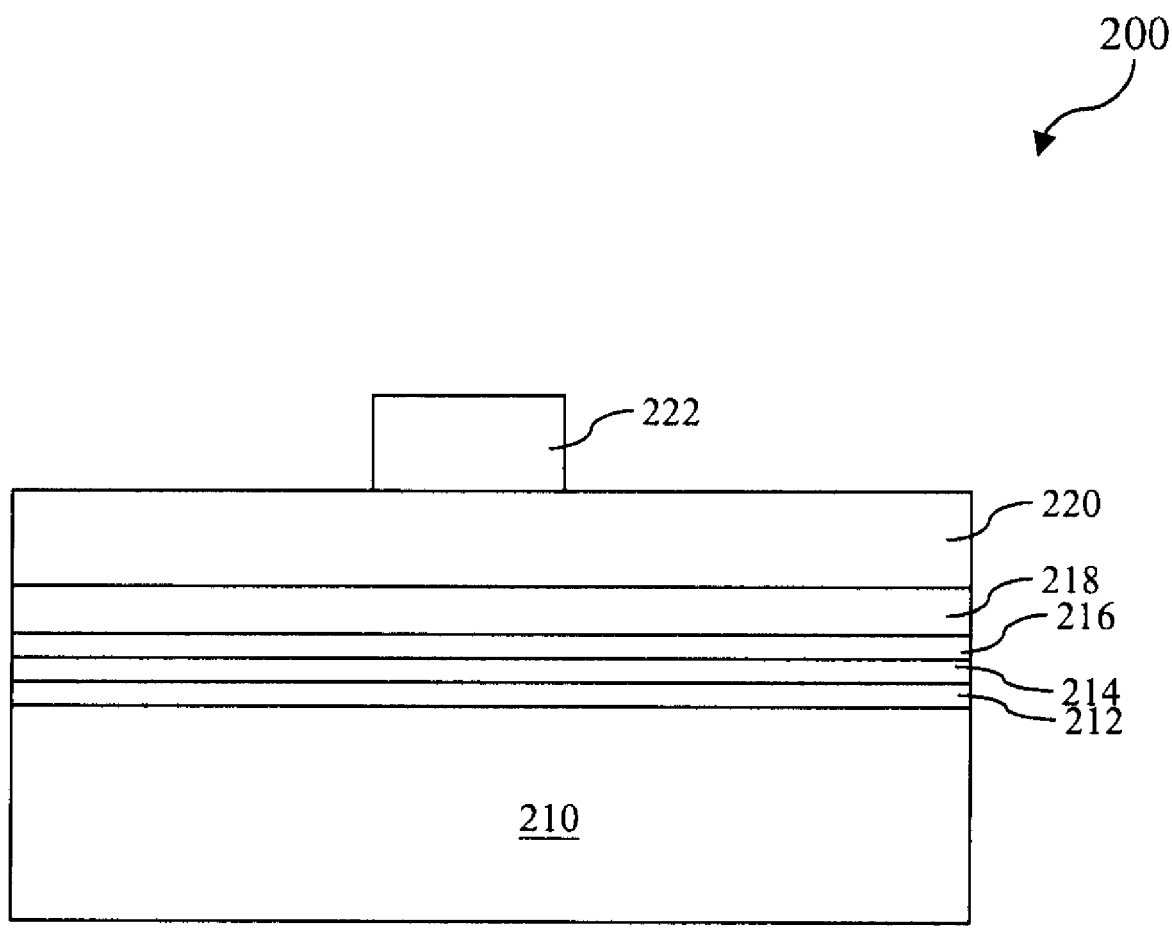
FIG. 2 is a sectional view of one embodiment of a semiconductor structure having a metal gate stack at a fabrication stage constructed according to various aspects of the present disclosure.

FIG. 1 is a flowchart of one embodiment of a method 100 making a semiconductor device having a metal gate stack constructed according to aspects of the present disclosure. FIG. 2 is a sectional view of one embodiment of a semiconductor structure 200 having a metal gate stack at a fabrication stage. The method 100 of making a semiconductor device is described with reference to FIGS. 1 and 2.

The method 100 begins at step 102 by providing a semiconductor substrate 210. The semiconductor substrate 210 includes silicon. Alternatively, the substrate 210 includes germanium or silicon germanium. In other embodiments, the substrate 210 may use another semiconductor material such as diamond, silicon carbide (SiC), gallium arsenic (GaAs), gallium arsenic phosphorus (GaAsP), aluminum indium arsenic (AlInAs), aluminum gallium arsenic (AlGaAs), gallium indium phosphorus (GaInP), or other proper combination thereof.

The method 100 proceeds to step 104 by forming various metal-gate-stack material layers on the semiconductor substrate 210. In one embodiment, a high k dielectric material layer is formed on the semiconductor substrate. A metal gate layer is formed on the high k dielectric material layer. A capping layer is further interposed between the high k dielectric material layer and the metal gate layer. The high k dielectric material layer is formed by a suitable process such as an atomic layer deposition (ALD). Other methods to form the high k dielectric material layer include metal organic chemical vapor deposition (MOCVD), physical vapor deposition (PVD), ultraviolet UV-Ozone Oxidation and molecular beam epitaxy (MBE). In one embodiment, the high k dielectric material includes hafnium oxide ($HfO_2$). In another embodiment, the high k dielectric material includes aluminum oxide ($Al_2O_3$). Alternatively, the high k dielectric material layer includes metal nitrides, metal silicates or other metal oxides.

The metal gate layer is formed by PVD or other suitable process. The metal gate layer includes titanium nitride. In another embodiment, the metal gate layer includes tantalum nitride, molybdenum nitride or titanium aluminum nitride. The capping layer is interposed between the high k dielectric material layer and the metal gate layer. The capping layer includes lanthanum oxide (LaO). The capping layer may alternatively includes other suitable material.

An exemplary embodiment of the metal gate layers is illustrated in FIG. 2 and further described below. A thin thermal silicon oxide layer 212 is formed on the silicon substrate 210. A high k dielectric material layer 214 is formed on the thermal silicon oxide layer 212 by ALD or other suitable process. The high k dielectric material includes $HfO_2$ or other suitable material. A capping layer 216 is formed on the high k dielectric material layer 214. The capping layer includes lanthanum oxide or other suitable material. A metal gate layer 218 is formed on the capping layer 216 by PVD or other suitable method. The metal gate layer includes titanium nitride or other proper material as provided above. A polysilicon layer 220 is formed on the metal gate layer 218 by CVD or other suitable method.

The method 100 proceeds to step 106 to pattern the polysilicon layer 220 and metal gate layer 218 by applying a first dry etching process in a dry etch tool, particularly in a dry etch chamber, using a patterned mask 222 defining various openings. The polysilicon layer and metal gate layer within the openings of the patterned mask are removed by the first dry etching process. In one embodiment, the first dry etching process utilizes fluorine-containing plasma to remove the polysilicon and the metal gate layer. Particularly, the first dry etching process uses fluorocarbon plasma. In one example, the etch gas includes CF4. Alternatively, the polysilicon and the metal gate layer are removed by two separate etch steps each with different etch gases tuned for etching polysilicon and etching metal gate layer, respectively. For example, the polysilicon etch gas may include Cl2, HBr, O2 or combinations thereof.

The patterned mask 222 is formed on the multiple metal-gate-stack layers. In one example, the patterned mask 222 is formed on the polysilicon layer 220 as illustrated in FIG. 2. In one embodiment, the patterned mask layer 222 include a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

In another embodiment, the patterned mask layer 222 includes a patterned hard mask layer. In one example, the patterned hard mask layer 222 includes silicon nitride. As one example of forming the patterned silicon nitride hard mask, a silicon nitride layer is deposited on the polysilicon layer by a low pressure chemical vapor deposition (LPCVD) process. The precursor including dichlorosilane (DCS or SiH2Cl2), bis(TertiaryButylAmino)silane (BTBAS or C8H22N2Si) and disilane (DS or Si2H6) is used in the CVD process to form the silicon nitride layer. The silicon nitride layer is further patterned using a photolithography process to form a patterned photoresist layer and an etching process to etch the silicon nitride within the openings of the patterned photoresist layer. Alternatively, other dielectric material may be used as the patterned hard mask. For example, silicon oxynitride may be used as the hard mask.

The method 100 proceeds to step 108 by applying a water steam (H2O steam) to the semiconductor structure 200 in the same dry etch tool to pattern the capping layer 216. In one example, the step 108 is performed in the same etch chamber wherein the first dry etching process is implemented. The capping layer 216 within the openings of the patterned mask layer 222 is removed at this step by the H2O steam. As one advantage, polymeric residue formed from the prior etching process can be substantially removed as well by the H2O steam. The H2O steam can react with lanthanum/lanthanum oxide and remove thereof. The exhaustive gas can be pumped out from the etch chamber in a low pressure.

Alternative to the H2O steam, the method 100 applies oxygen plasma or argon plasma to pattern the capping layer 216 of the semiconductor structure 200 in the same dry etch tool, particularly in the same dry etch chamber. The capping layer 216 within the openings of the patterned mask layer is removed by the oxygen plasma or argon plasma. Similarly, polymeric residue is substantially removed by the oxygen plasma or argon plasma as well. The oxygen plasma or argon plasma is applied to the semiconductor structure 200 at the room temperature. Alternatively, the oxygen plasma or argon plasma may be applied to the semiconductor structure 200 at a temperature ranging between about 20 C. and about 50 C.

The method 100 proceeds to step 110 to pattern the high k dielectric material layer 214 by applying a second dry etching process in the same dry etch tool, particularly in the same dry etch chamber. The second dry etching process is tuned in terms of etchant and etching conditions to effectively remove the high k dielectric material layer. The high k dielectric material layer within the openings of the patterned mask is substantially removed by the second dry etching process. In one embodiment, the second dry etching process utilizes fluorine-containing plasma to remove the high k dielectric material layer. In other embodiments, the second dry etching process utilizes an etch chemistry including at least one of fluorine, chlorine and inert gas to remove the high k dielectric material layer.

The method 100 proceeds to step 112 by applying a wet etching process to remove polymeric residue or other residue formed on the substrate and/or sidewalls of the metal gate stack. The wet etching process is designed to effectively remove the polymeric residue and other contamination. For example, a SC1 solution including ammonium hydroxide (NH4OH) and peroxide (H2O2) is used at this wet etching process. In another example, a solution including sulfuric acid (H2SO4) and peroxide (H2O2) may be used at this wet etching process. The wet etching process may be implemented in a wet etch tool.

In this method, the first dry etching step to remove the metal gate layer, the second dry etching step to remove the high k dielectric material layer, and an etch step with H2O steam or O2/Ar plasma to remove the capping layer are integrated to be performed in the same etch tool, particularly in the same etch chamber. Therefore, the fabrication is simplified and cycle time is reduced. Furthermore, the production cost is reduced accordingly. The disclosed method utilizes a H2O steam or O2/Ar plasma to the semiconductor structure to effectively remove the capping layer such as lanthanum oxide (LaO) and the polymeric residue. It is understood that the embodiments disclosed herein offer several different embodiments, and that no particular advantage is necessarily required for all embodiments.

Although not shown, other processing step may present to form various doped regions such as source and drain regions, devices features such as multilayer interconnection (MLI). In one example, lightly doped drain (LDD) regions are formed after the formation of the gate stack. A gate spacer may be formed on the sidewalls of the metal gate stack. Then the source and drain regions are formed substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials.

The multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor substrate may further include additional isolation features to isolate each from other devices. The isolation features may include different structures and can be formed using different processing technologies. For example, an isolation feature may include shallow trench isolation (STI) features. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The semiconductor structure 200 serves only as one example of a device within which various aspects of the method 100 may be implemented. The semiconductor structure 200 and the method 100 of making the same may be used in other semiconductor devices having a high k and metal gate features, such as strained semiconductor substrate, a hetero-semiconductor device or a stress-free isolation structure.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the disclosed method is used to form an n-type metal-oxide-semiconductor field-effect-transistor (NMOSFET). In another embodiment, the disclosed method is used to form a metal gate stack in a gate-first process in which the metal gate stack is formed by the method 100 and remains in the final structure. In another embodiment, the disclosed method is used to form a metal gate stack in a hybrid process in which the first type metal gate stack (such as NMOS metal gate stack) is formed by the method 100 and remains in the final structure. The second type of the metal gate stack (such as PMOS metal gate stack) is formed as a dummy gate structure so that source/drain ion implantation processes and annealing processes can be implemented. Thereafter, a portion of the dummy gate stack is removed and the dummy gate trench is refilled with proper materials. For example, the polysilicon layer and metal layer in the PMOS region are removed. Then p metal is refilled and another metal such as copper is further filled in to form PMOS metal gate stack.

In another embodiment, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

Thus, the present disclosure provides a method for making metal gate stacks of a semiconductor device. The method includes applying a first dry etching process to a semiconductor substrate in an etch chamber through openings of a patterned mask layer defining gate regions, removing a polysilicon layer and a metal gate layer on the semiconductor substrate; applying a H2O steam to the semiconductor substrate in the etch chamber, removing a capping layer on the semiconductor substrate; and applying a second dry etching process to the semiconductor substrate in the etch chamber, removing a high k dielectric material layer.

The disclosed method further includes applying a wet etching process to the semiconductor substrate to remove polymeric residue after the applying the second dry etching process. The capping layer includes Lanthanum oxide (LaO) in one embodiment. The applying of the H2O steam may implement H2O to the capping layer with an etch rate grater than about 30 angstrom per minute. The semiconductor device is an N-type metal-oxide-semiconductor field-effect-transistor (NMOSFET) in one embodiment. The metal gate layer may include titanium nitride. The metal gate layer may include a conductive material selected from the group consisting of tantalum nitride, molybdenum nitride and titanium aluminum nitride. The applying H2O steam may include providing the semiconductor substrate a temperature higher than about 100 C. The patterned hard mask may include silicon nitride.

The present disclosure also provide another embodiment of a method for making metal gate stacks of a semiconductor device. The method includes applying a first dry etching process to a semiconductor substrate in an etch chamber through openings of a patterned mask layer defining gate regions, removing a gate metal layer on the semiconductor substrate; applying at least one of oxygen plasma and argon plasma to the semiconductor substrate in the etch chamber, removing a capping layer; applying a second dry etching process to the semiconductor substrate in the etch chamber, removing a high k dielectric material layer; and applying a wet etching process to the semiconductor substrate to remove polymeric residue.

In various embodiments of the disclosed method, the capping layer may include lanthanum oxide (LaO). The metal gate layer may include a conductive material selected from the group consisting of titanium nitride, tantalum nitride, molybdenum nitride and titanium aluminum nitride. The applying of the first dry etching process may include applying the first dry etching process to further remove a polysilicon layer on the metal gate layer.

The present disclosure also provide another embodiment of a method for making a semiconductor device. The method includes applying a first dry etching process to a semiconductor substrate in an etch chamber to remove a metal gate layer; applying at least one of H2O steam, oxygen plasma and argon plasma to the semiconductor substrate in the etch chamber to remove a capping layer; and applying a second dry etching process to the semiconductor substrate in the etch chamber to remove a high k dielectric material layer, forming a metal gate stack.

The disclosed method may further include, before the applying of the first dry etching process, patterning a mask layer on the metal gate layer defining a gate region. The method may further include applying a wet etching process to the semiconductor substrate in a wet etch tool to remove polymeric residue after the second dry etch process. The capping layer may include La oxide. The applying of the first dry etching process may include applying the first dry etching process to a polysilicon layer on the metal gate layer. The metal gate stack is a metal gate structure of an N-type metal-oxide-semiconductor field-effect-transistor (NMOSFET) in one embodiment. The metal gate layer may include titanium nitride.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for making metal gate stacks of a semiconductor device comprising:
    applying a first dry etching process to a semiconductor substrate in an etch chamber through openings of a patterned mask layer defining gate regions to remove a polysilicon layer and a metal gate layer on the semiconductor substrate;
    applying only a $H_2O$ steam to the semiconductor substrate in the etch chamber to pattern a capping layer on the semiconductor substrate, wherein only applying the $H_2O$ steam includes only the $H_2O$ steam etching a portion of the capping layer to pattern the capping layer, wherein the capping layer includes Lanthanum (La) oxide; and
    applying a second dry etching process to the semiconductor substrate in the etch chamber to remove a high k dielectric material layer on the semiconductor substrate.

2. The method of claim 1, further comprising applying a wet etching process to the semiconductor substrate to remove polymeric residue after the applying the second dry etching process.

3. The method of claim 1, wherein the applying of only the $H_2O$ steam comprises applying only $H_2O$ to etch the capping layer with an etch rate grater than about 30 angstrom per minute, wherein the $H_2O$ performs the etching of the capping layer.

4. The method of claim 1, wherein the semiconductor device is an N-type metal-oxide-semiconductor field-effect-transistor (NMOSFET).

5. The method of claim 1, wherein the metal gate layer comprises titanium nitride.

6. The method of claim 1, wherein the metal gate layer comprises a conductive material selected from the group consisting of tantalum nitride, molybdenum nitride and titanium aluminum nitride.

7. The method of claim 1, wherein the patterned hard mask comprises silicon nitride.

8. A method for making metal gate stacks of a semiconductor device comprising:
    applying a first dry etching process to a semiconductor substrate in an etch chamber through openings of a patterned mask layer defining gate regions to remove a gate metal layer on the semiconductor substrate;
    applying only $H_2O$ steam to the semiconductor substrate in the etch chamber to remove a capping layer on the semiconductor substrate, wherein the capping layer includes Lanthanum (La) oxide;
    applying a second dry etching process to the semiconductor substrate in the etch chamber to remove a high k dielectric material layer on the semiconductor substrate; and
    applying a wet etching process to the semiconductor substrate to remove polymeric residue,
    wherein the semiconductor substrate remains in the etch chamber between applying the first dry etching process, applying only $H_2O$ steam, and applying the second dry etching process.

9. The method of claim 8, wherein the metal gate layer comprises a conductive material selected from the group consisting of titanium nitride, tantalum nitride, molybdenum nitride and titanium aluminum nitride.

10. The method of claim 8, wherein the applying of the first dry etching process comprises applying the first dry etching process to further remove a polysilicon layer on the metal gate layer.

11. A method for making a semiconductor device comprising:
    applying a first dry etching process to a semiconductor substrate in an etch chamber to remove a metal gate layer on the semiconductor substrate;
    applying only a $H_2O$ steam to the semiconductor substrate in the etch chamber to remove a capping layer on the semiconductor substrate, wherein applying only the $H_2O$ steam includes only the $H_2O$ steam etching the capping layer to remove the capping layer on the semiconductor substrate; wherein the capping layer comprises La oxide; and
    applying a second dry etching process to the semiconductor substrate in the etch chamber to remove a high k dielectric material layer on the semiconductor substrate to form a metal gate stack on the semiconductor substrate.

12. The method of claim 11, further comprising, before the applying of the first dry etching process, patterning a mask layer on the metal gate layer defining a gate region.

13. The method of claim 11, further comprising applying a wet etching process to the semiconductor substrate in a wet etch tool to remove polymeric residue after the second dry etch process.

14. The method of claim 11, wherein the applying of the first dry etching process comprises applying the first dry etching process to a polysilicon layer on the metal gate layer.

15. The method of claim 11, wherein the metal gate stack is a metal gate structure of an N-type metal-oxide-semiconductor field-effect-transistor (NMOSFET).

16. The method of claim 11, wherein the metal gate layer comprises titanium nitride.

17. The method of claim 1, wherein the semiconductor substrate remains in the etch chamber between applying the first dry etching process, applying the $H_2O$ steam, and applying the second dry etching process.

* * * * *